United States Patent
Inoue et al.

(10) Patent No.: US 10,196,737 B2
(45) Date of Patent: Feb. 5, 2019

(54) VAPOR DEPOSITION DEVICE AND METHOD FOR PRODUCING ORGANIC EL DISPLAY DEVICE

(71) Applicant: Sharp Kabushiki Kaisha, Sakai, Osaka (JP)

(72) Inventors: Satoshi Inoue, Sakai (JP); Shinichi Kawato, Sakai (JP); Yuhki Kobayashi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/063,295

(22) PCT Filed: Nov. 25, 2016

(86) PCT No.: PCT/JP2016/085022
§ 371 (c)(1),
(2) Date: Jun. 18, 2018

(87) PCT Pub. No.: WO2018/096659
PCT Pub. Date: May 31, 2018

(65) Prior Publication Data
US 2018/0371604 A1    Dec. 27, 2018

(51) Int. Cl.
*H01L 21/00* (2006.01)
*C23C 14/24* (2006.01)
(Continued)

(52) U.S. Cl.
CPC ............ *C23C 14/24* (2013.01); *C23C 14/042* (2013.01); *C23C 14/12* (2013.01); *H01L 51/0011* (2013.01); *H01L 51/56* (2013.01)

(58) Field of Classification Search
None
See application file for complete search history.

(56) References Cited

U.S. PATENT DOCUMENTS

2012/0183676 A1* 7/2012 Sonoda ............... C23C 14/042
427/8
2013/0273679 A1   10/2013 Sonoda et al.
(Continued)

FOREIGN PATENT DOCUMENTS

| JP | 2005-146338 A | 6/2005 |
| JP | 2014-109072 A | 6/2014 |
| WO | 2012/090777 A1 | 7/2012 |

OTHER PUBLICATIONS

Official Communication issued in International Patent Application No. PCT/JP2016/085022, dated Jan. 10, 2017.

*Primary Examiner* — Thien F Tran
(74) *Attorney, Agent, or Firm* — Keating & Bennett, LLP

(57) ABSTRACT

On a vapor deposition target surface of a vapor deposition target substrate placed on a substrate tray in a vapor deposition device, display regions on which vapor deposition particles are to be deposited are arranged in alignment to be apart from each other in a direction parallel with a scanning direction, and the substrate tray includes a blocking part configured to block the vapor deposition particles to be deposited onto regions adjacent to the display regions in a direction parallel with the scanning direction. This prevents a degree of freedom in designing of the vapor deposition target substrate from being restricted even in performing scan vapor deposition.

10 Claims, 17 Drawing Sheets

(51) Int. Cl.
*H01L 51/56* (2006.01)
*C23C 14/12* (2006.01)
*C23C 14/04* (2006.01)
*H01L 51/00* (2006.01)

(56) References Cited

U.S. PATENT DOCUMENTS

2013/0295705 A1* 11/2013 Sonoda ............... H01L 51/0011
438/34
2014/0154403 A1 6/2014 Lee

* cited by examiner

23

23Aa
23A
23Ab

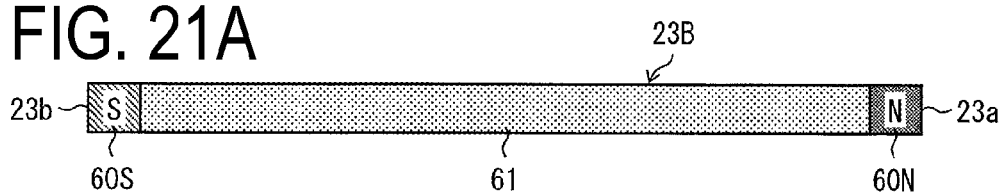
FIG. 21A
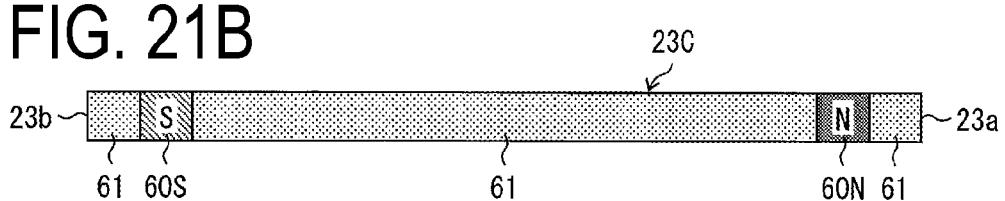
FIG. 21B
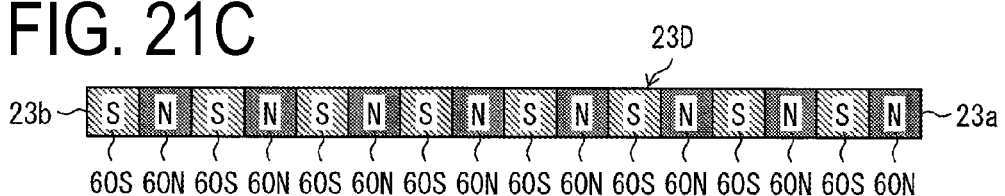
FIG. 21C
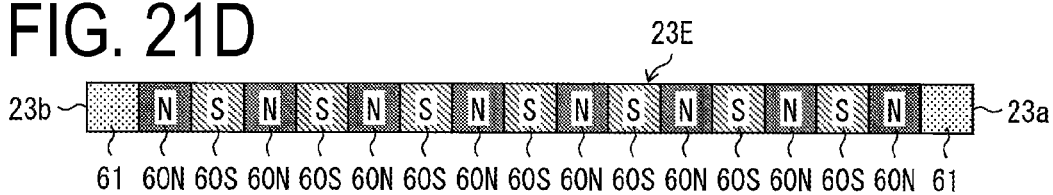
FIG. 21D
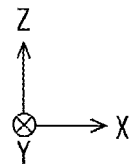

VAPOR DEPOSITION DEVICE AND METHOD FOR PRODUCING ORGANIC EL DISPLAY DEVICE

TECHNICAL FIELD

The disclosure relates to a vapor deposition device for producing an organic EL display device, and a method for producing an organic EL display device by use of the vapor deposition device.

BACKGROUND ART

An organic EL (electroluminescence) display device includes pixels provided in a matrix on each of display regions, an organic EL layer being formed in each of the pixels, and the organic EL (electroluminescence) display device makes the organic EL layer emit light to display an image.

In an organic EL display device displaying in full color, organic EL layers emitting light of red (R), green (G), and blue (B) colors are typically formed in each pixel. For this reason, the organic EL layers are formed into a pattern on a prescribed pixel for each light emission color by vapor deposition using a vapor deposition mask (hereinafter, may be referred to as selective coating deposition in some cases).

A method for depositing such organic EL layers on a vapor deposition target substrate is roughly classified into a method in which a relative position between a vapor deposition mask and a vapor deposition target substrate is fixed for vapor deposition as described in PTL 1, and a scan vapor deposition technique in which a vapor deposition target substrate relatively moves with respect to a vapor deposition mask for vapor deposition.

In the former method in which a relative position between the vapor deposition mask and the vapor deposition target substrate is fixed for the vapor deposition, the vapor deposition mask having almost the same area as the vapor deposition target substrate or having a certain area size, even though the vapor deposition mask does not have almost the same area as the vapor deposition target substrate. Therefore, as the vapor deposition target substrate is larger in size, the vapor deposition mask is also larger in size. As the vapor deposition mask is larger in size, deformation under its own weight or elongation due to heat is increased to readily cause a misalignment of a vapor deposition position or mixing of colors. This makes it difficult to enable high definition.

Hence, as a method for depositing organic EL layers on the vapor deposition target substrate, scan vapor deposition has attracted attention.

FIG. 17 is a perspective view illustrating a configuration of a vapor deposition device in the related art. As illustrated in FIG. 17, a vapor deposition device 101 includes a vapor deposition source 102, a vapor deposition mask 110 located above the vapor deposition source 102, and a substrate tray 120 movable along a rail 103. A direction along which the rail 103 extends is referred to as X-axis direction.

The vapor deposition mask 110 includes mask frame parts 110a and a mask body part 110c, ends of which are held by the mask frame parts 110a. The mask body part 110c includes vapor deposition regions 111 aligned in Y-axis direction perpendicular to X-axis direction. In each vapor deposition region 111, multiple slits 111a each corresponds to a width of a pixel formation region for any of red, green, or blue in the vapor deposition target substrate.

On the vapor deposition source 102, an emission outlet 102a is formed for emitting vapor deposition particles that are filled in the vapor deposition source 102.

FIG. 18 is a diagram illustrating a state where vapor deposition is started in the vapor deposition device of the related art. As illustrated in FIG. 18, a vapor deposition target substrate 130 is placed on the substrate tray 120 in such a way that a vapor deposition target surface 130a on which display regions 131 are formed in a matrix faces toward the vapor deposition source 102 and a rear surface 130b on the other side of the vapor deposition target substrate 130 faces upward.

The substrate tray 120, on which the vapor deposition target substrate 130 is placed, travels along the rails 103 in a direction illustrated by an arrow X1 (scanning direction), and the vapor deposition target substrate 130 is scanned. The vapor deposition particles are emitted from the emission outlet 102a on the vapor deposition source 102 in Z-axis direction (axis perpendicular to X-Y plane), and then the vapor deposition particles are deposited on the vapor deposition target surface 130a of the vapor deposition target substrate 130 through the slits 111a.

CITATION LIST

Patent Literature

PTL 1: JP 2005-146338 A

SUMMARY

Technical Problem

FIG. 19 is a diagram illustrating a state of the vapor deposition target surface 130a of the vapor deposition target substrate 130, on which the vapor deposition particles are deposited by the vapor deposition device 101 in the related art.

In each display region 131 on the vapor deposition target substrate 130, provided are a red pixel formation region row 133R, in which red pixel formation regions are arranged in line and an organic EL layer for emitting red light is formed to provide a pixel in each of the red pixel formation regions, a green pixel formation region row 133G, which is laterally arranged adjacently to the red pixel formation region row 133R and in which green pixel formation regions are arranged in line and an organic EL layer for emitting green light is formed to provide a pixel in each of the green pixel formation regions, and a blue pixel formation region row 133B, which is laterally arranged adjacently to the green pixel formation region row 133G and in which blue pixel formation regions are arranged in line and an organic EL layer for emitting blue light is formed to provide a pixel in each of the blue pixel formation regions.

Assuming that an organic EL layer 140R emitting red light is deposited in line on the red pixel formation region row 133R among the red, green and blue pixel formation region rows 133R, 133G, and 133B.

Then, in the vapor deposition device 101, the organic EL layer 140R is deposited on not only the red pixel formation region row 133R in the display region 131 but also the entire region from one end to the other end of the vapor deposition target substrate 130 including a region 131c adjacent to the display region 131 in X-axis direction.

Therefore, circuit components to be failed due to adhesion of the vapor deposition particles, such as a terminal, cannot be arranged on the region 131c adjacent to the display region 131 in X-axis direction. This imposes a limitation on the design.

The disclosure has been made in consideration of the above issues in the related art and has an object to provide a vapor deposition device for preventing a restriction on a degree of freedom for designing a vapor deposition target substrate even when the scan vapor deposition is performed, and a method for producing an organic EL display device.

Solution to Problem

To address the above issues, a vapor deposition device according an aspect of the disclosure includes a vapor deposition mask; a vapor deposition source configured to emit vapor deposition particles toward the vapor deposition mask; and a substrate tray on which a vapor deposition target substrate is placed, the substrate tray being configured to cause the vapor deposition target substrate to perform a relative movement with respect to the vapor deposition mask. On a vapor deposition target surface of the vapor deposition target substrate, display regions are provided in alignment to be apart from each other in a direction parallel with a direction of the relative movement, and pixel formation regions on which the vapor deposition particles are to be deposited are provided in a matrix in each of the display regions, and the substrate tray includes a blocking part configured to block the vapor deposition particles to be deposited onto a region adjacent to the display region in the direction parallel with the direction of the relative movement.

To address the above issues, a method for producing an organic EL display according an aspect of the disclosure, includes causing a substrate tray on which a vapor deposition target substrate is placed to perform a relative movement with respect to a vapor deposition mask; and emitting vapor deposition particles from a vapor deposition source toward the vapor deposition mask. On a vapor deposition target surface of the vapor deposition target substrate, display regions are provided in alignment to be apart from each other in a direction parallel with a direction of the relative movement, and pixel formation regions on which the vapor deposition particles are to be deposited are provided in a matrix in each of the display regions, and in the causing the substrate tray to perform the relative movement and the emitting the vapor deposition particles, an organic EL layer is formed, while blocking the vapor deposition particles to be deposited onto a region adjacent to the display regions in the direction parallel with the direction of the relative movement, by vapor depositing the vapor deposition particles onto the pixel formation regions.

Advantageous Effects of Disclosure

According to an aspect of the disclosure, an advantageous effect is achieved that a degree of freedom in designing of a vapor deposition target substrate is prevented from being restricted.

BRIEF DESCRIPTION OF DRAWINGS

FIG. 21A is a side view illustrating a state of a crosspiece according to a fourth embodiment of the disclosure, and illustrates a state where both ends of the crosspiece are polarized.

FIG. 21B illustrates a state where inner side portions of both ends are polarized.

FIG. 21C illustrates a state where a portion between both ends is polarized alternately to S poles and N poles.

FIG. 21D is a diagram illustrating a portion between inner side portions of both ends is polarized alternately to S poles and N poles.

DESCRIPTION OF EMBODIMENTS

First Embodiment

Figure 1:
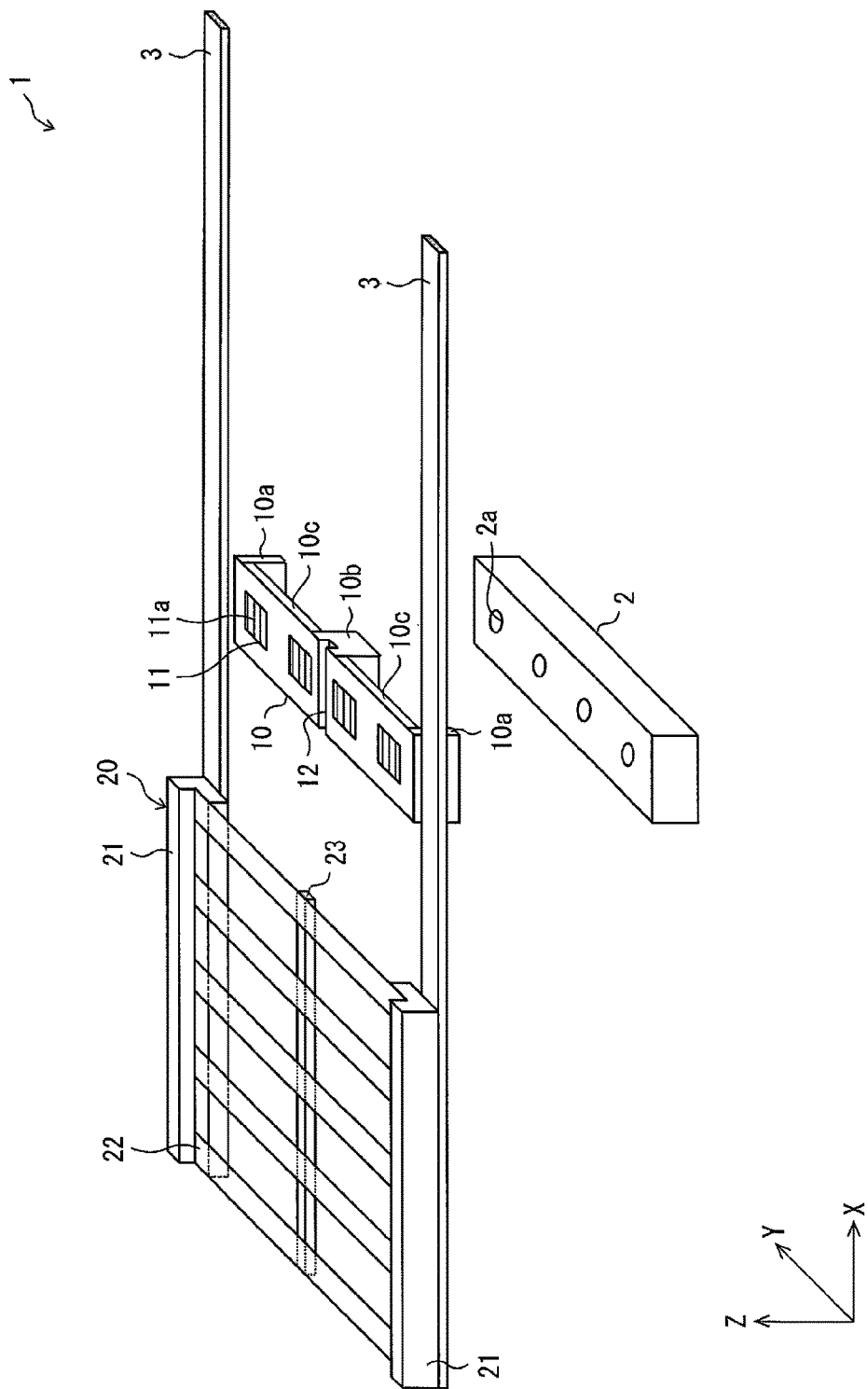
FIG. 1 is a perspective view illustrating a schematic configuration of a vapor deposition device according to a first embodiment of the disclosure.

FIG. 1 is a perspective view illustrating a schematic configuration of a vapor deposition device 1 according to a first embodiment of the disclosure.

As illustrated in FIG. 1, the vapor deposition device 1 includes a vapor deposition source 2, a rail 3, a vapor deposition mask 10, and a substrate tray 20.

Although not illustrated in the FIG. 1, the vapor deposition device 1 includes a controller configured to control driving of the vapor deposition device 1, including movement control of the substrate tray 20 and vapor deposition control of the vapor deposition source 2. The vapor deposition device 1 may include, between the vapor deposition source 2 and the vapor deposition mask 10, a shutter for blocking vapor deposition particles emitted from the vapor deposition source 2 at a prescribed time interval, and a restriction plate for restricting spreading in Y-axis direction of the vapor deposition particles emitted from the vapor deposition source 2. The known shutter and restriction plate may be used.

The vapor deposition source 2, the vapor deposition mask 10, and the rail 3 are arranged at certain intervals in Z-axis direction.

The rail 3 extends in X-axis direction (direction parallel with a relative movement direction). The rail 3 serves as a guide for moving the substrate tray 20 in X-axis direction. The rail 3 is fixed to the vapor deposition device 1.

The vapor deposition source 2 is a container holding a vapor deposition material in the vapor deposition source. The vapor deposition source 2 is located below the rail 3 (on a negative side in Z-axis direction). The vapor deposition source 2 has a rectangular shape, as an example. Multiple emission outlets 2a (through holes, nozzles) for emitting the vapor deposition particles are formed on an upper face of the vapor deposition source 2 (surface facing the vapor deposition mask 10). The emission outlets 2a are arranged to align at a certain pitch in Y-axis direction.

The vapor deposition source 2 heats the vapor deposition material to be evaporated (in a case where the vapor deposition material is a liquid material) or sublimated (in a case where the vapor deposition material is a solid material) to generate the gaseous vapor deposition particles. The vapor deposition source 2 emits the vapor deposition material made into a gas in this way as the vapor deposition particles from the emission outlet 2a toward the vapor deposition mask 10.

Note that FIG. 1 illustrates an example in which the vapor deposition source 2 includes the multiple emission outlets 2a, but the number of the emission outlets 2a is not specifically limited and may be at least one.

The emission outlets 2a may be arranged one-dimensionally (that is, linearly) in Y-axis direction as illustrated in FIG. 1, or two-dimensionally (that is, planarly (tile-like)).

The vapor deposition mask 10 is arranged between the vapor deposition source 2 and the rail 3. The vapor deposition mask 10 is detachably fixed to the vapor deposition device 1.

The vapor deposition mask 10 includes mask end frame parts 10a, 10a, a mask center frame part 10b, and mask body parts 10c, 10c. The mask end frame parts 10a, 10a are located at both ends of the vapor deposition mask 10 aligned in Y-axis direction, and are respectively arranged at or near the rails 3. The mask center frame part 10b is located at a center part of the vapor deposition mask 10, and is arranged between the mask end frame parts 10a, 10a.

Sides of one mask body part 10c opposite to each other in Y-axis direction are connected respectively with the mask end frame part 10a and the mask center frame part 10b, and sides of the other mask body part 10c opposite to each other in Y-axis direction are connected respectively with the mask center frame part 10b and the mask end frame part 10a.

The mask end frame parts 10a, 10a, the mask center frame part 10b, and the mask body parts 10c, 10c may be made of the same material to be formed together into a single part, or may be made of different materials. For example, the mask end frame parts 10a, 10a, the mask center frame part 10b, and the mask body parts 10c, 10c can be made of materials, such as Invar materials, which are not substantially deformed, even in a case where such materials are applied with high-temperature heat.

The mask end frame parts 10a, 10a, and the mask center frame part 10b are thicker than the mask body parts 10c, 10c, and thus increase the rigidity of the vapor deposition mask 10.

A recessed portion 12 extending in X-axis direction is arranged at a center part of an upper face of the mask center frame part 10b. The recessed portion 12 is a recessed portion for allowing the crosspiece 23 of the substrate tray 20 to pass through the recessed portion 12. A specific description is given later.

The mask body parts 10c, 10c are thinner than the mask end frame parts 10a, 10a and the mask center frame part 10b. On the mask body parts 10c, 10c, formed are slits 11a for vapor deposition onto a vapor deposition target substrate, and such a configuration enables forming of a vapor deposition film with accuracy. As an example, a thickness of each of the mask body parts 10c, 10c is about 30 μm.

On the mask body parts 10c, 10c, vapor deposition regions 11 each having an area corresponding to a display region formed on a film formation target substrate are provided. In the vapor deposition regions 11, a slit 11a having a width that is the same as a width of a pixel formation region in the film formation target substrate is provided. The slit 11a is a mask opening for passing the vapor deposition particles in performing vapor deposition. The slit 11a is provided to correspond to a pattern of a part of the vapor deposition region on the film formation target substrate such that the vapor deposition particles do not adhere to other region than the targeted vapor deposition region on the film formation target substrate. To be more specific, a position of the slit 11a corresponds to a position of a red pixel formation region in a case of depositing an organic EL layer for emitting red light, a position of a green pixel formation region in a case of depositing an organic EL layer for emitting green light, and a position of a blue pixel formation region in a case depositing organic EL layer for emitting blue light.

Examples of the vapor deposition mask 10 include, for example, Fine Metal Mask.

The substrate tray 20 is used, in scanning the vapor deposition target substrate placed on the substrate tray 20 in X-axis direction along the rails 3. This allows the vapor deposition target substrate to pass over the vapor deposition mask 10. In other words, the substrate tray 20 relatively moves the vapor deposition target substrate placed on the substrate tray 20 with respect to the vapor deposition mask 10. In this way, the vapor deposition device 1 performs the scan vapor deposition. In the vapor deposition device 1, the substrate tray 20 may be fixed, so that the vapor deposition mask 10 and the vapor deposition source 2 may travel in X-axis direction.

The substrate tray 20 includes placing parts 21, 21 to be put into contact with the vapor deposition target substrate when the vapor deposition target substrate is placed, multiple blocking parts 22 provided between the placing parts 21, 21, and the crosspiece (bar-shaped member) 23 for connecting the blocking parts 22 with each other.

Each of the placing parts 21, 21 is located on corresponding rail 3 to slide on the rail 3 along the rail 3. The placing parts 21, 21 are provided to align in Y-axis direction and are put into contact with edges near opposite sides of the vapor deposition target substrate to support the vapor deposition target substrate. Each of the placing parts 21, 21 has an L-shaped cross section in Y-axis direction, as an example, but not limited to this shape.

The blocking parts 22 block in such a way as not to vapor deposit on a region adjacent to the display region in a direction parallel with the scanning direction on the vapor deposition target substrate placed on the substrate tray 20. Examples of materials of the blocking part 22 may include Invar material, nickel, polyimide, SUS, and aluminum.

The blocking parts 22 are arranged to connect the placing parts 21, 21 aligned in Y-axis direction with each other. To be specific, the blocking parts 22 extend in Y-axis direction, and are spread between the placing parts 21, 21 aligned in Y-axis direction. The blocking parts 22 include multiple blocking parts 22 arranged to align in X-axis direction.

The blocking parts 22 are arranged in such a way as not to overlap the display region on the vapor deposition target substrate when the vapor deposition target substrate is placed on the substrate tray 20, that is, arranged at locations overlapping a region adjacent to the display region on the vapor deposition target substrate in a direction parallel with the scanning direction.

The crosspiece 23 is a bar-shaped member supporting the multiple blocking parts 22 so that the multiple blocking parts 22 do not loose. Examples of materials of the crosspiece 23 may include Invar material, SUS, and aluminum.

The crosspiece 23 are arranged to connect the blocking parts 22 aligned in X-axis direction with each other. To be specific, the crosspiece 23 extends in X-axis direction, and extends on and across surfaces of the multiple blocking parts 22 aligned in X-axis direction, on a side that the vapor deposition source 2 is arranged. The crosspiece 23 is arranged at a center portion between the placing parts 21, 21.

The crosspiece 23 is arranged in such a way as not to overlap the display region on the vapor deposition target substrate in a case where the vapor deposition target substrate is placed on the substrate tray 20, that is, the crosspiece 23 is arranged at a location overlapping a region adjacent to the display region on the vapor deposition target substrate in a direction perpendicular to the scanning direction.

Note that in the first embodiment, a configuration in which only one crosspiece 23 is arranged is described, but multiple crosspieces 23 may be arranged. Also, in a case that multiple crosspieces 23 are arranged, each of the crosspieces 23 is arranged at a location overlapping the region adjacent to the display region on the vapor deposition target substrate in the direction perpendicular to the scanning direction.

In the case that multiple crosspieces 23 are arranged, multiple recessed portions 12 are arranged in the vapor deposition mask 10 at locations corresponding to the respective crosspieces 23.

Figure 2:
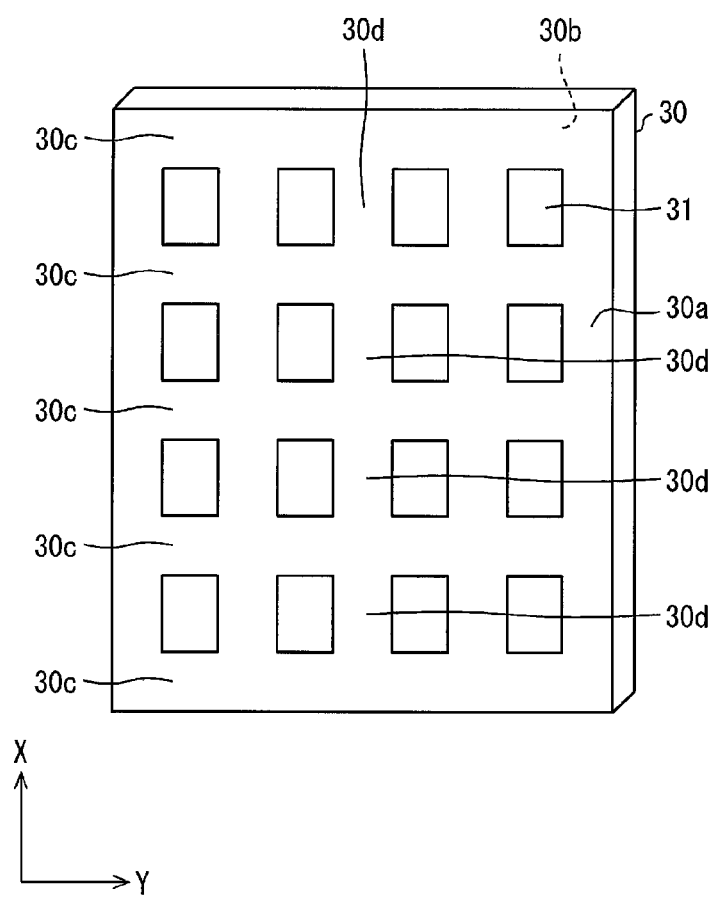
FIG. 2 is a diagram illustrating a vapor deposition target surface of a vapor deposition target substrate to be placed on a substrate tray in the vapor deposition device according to the first embodiment of the disclosure.

FIG. 2 is a diagram illustrating a vapor deposition target surface 30a of the vapor deposition target substrate 30 to be placed on the substrate tray 20.

The vapor deposition target surface 30a of the vapor deposition target substrate 30 is a surface on which a TFT element for driving each pixel, an interlayer insulating film, an edge cover, and the like are formed on a glass substrate, and a rear surface 30b is an opposite surface of the glass substrate (on which the TFT element and the like are not formed).

The display regions 31 are formed in a matrix on the vapor deposition target surface 30a of the vapor deposition target substrate 30. To be specific, the display regions 31 are formed in alignment to be apart from each other in X-axis direction (direction parallel with a direction of the relative movement) and in Y-axis direction (direction perpendicular to the direction of the relative movement).

On the region 30c adjacent to the display region 31 in X-axis direction (direction parallel with the direction of the relative movement), located may be circuit components, not illustrated, such as terminals and various wirings for controlling the driving of the pixels, and such circuit components are to be failed due to adhesion of the vapor deposition particles. Demanded films and the like are formed in the respective display regions 31, and then the respective display regions 31 are divided into discrete pieces to constitute an organic EL display device.

Figure 3:
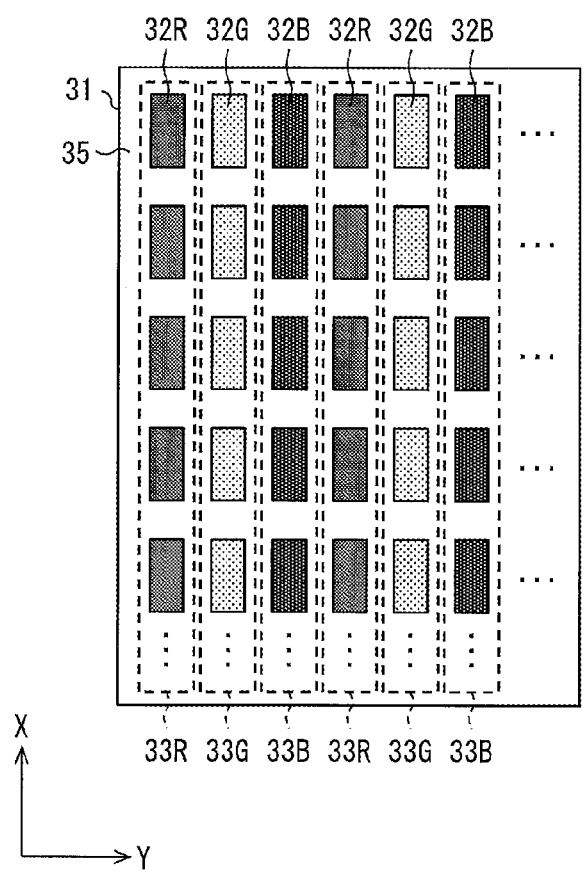
FIG. 3 is an enlarged diagram illustrating a schematic view of a display region formed on the vapor deposition target surface.

FIG. 3 is an enlarged diagram illustrating a schematic view of the display regions 31 on the vapor deposition target substrate 30. There are formed, in each display region 31, pixel formation regions 32R, 32G, and 32B in a matrix. Each of the pixel formation regions 32R, 32G, and 32B is a recessed portion surrounded by an edge cover 35.

An organic EL layer for emitting red light is vapor deposited on the the pixel formation region 32R serving as the recessed portion, an organic EL layer for emitting green light is vapor deposited on the pixel formation region 32G serving as the recessed portion, an organic EL layer for emitting blue light is vapor deposited on the pixel formation region 32B serving as the recessed portion. Then, a pixel for emitting red light, a pixel for emitting green light, and a pixel for emitting blue light are respectively configured.

A pixel array of an organic EL display device constituted by the vapor deposition target substrate 30 is a so-called stripe array in which pixels of the same light emission colors are arranged in line in the scanning direction.

Formed are a pixel formation region row 33R in which the multiple pixel formation regions 32R are aligned in a row in the scanning direction (direction from upper toward lower on a paper plane in FIG. 3), a pixel formation region row 33G in which the multiple pixel formation regions 32G are aligned in a row in the scanning direction, and a pixel formation region row 33B in which the multiple pixel formation regions 32B are aligned in a row in the scanning direction.

Other than pixels including the organic EL layers for emitting red light, green light, and blue light, a pixel including an organic EL layer for emitting another color may be provided. In a case that a full color image is displayed using a color filter, an organic EL layer for emitting white light may be deposited on each of the pixel formation regions 32R, 32G, and 32B.

Figure 4:
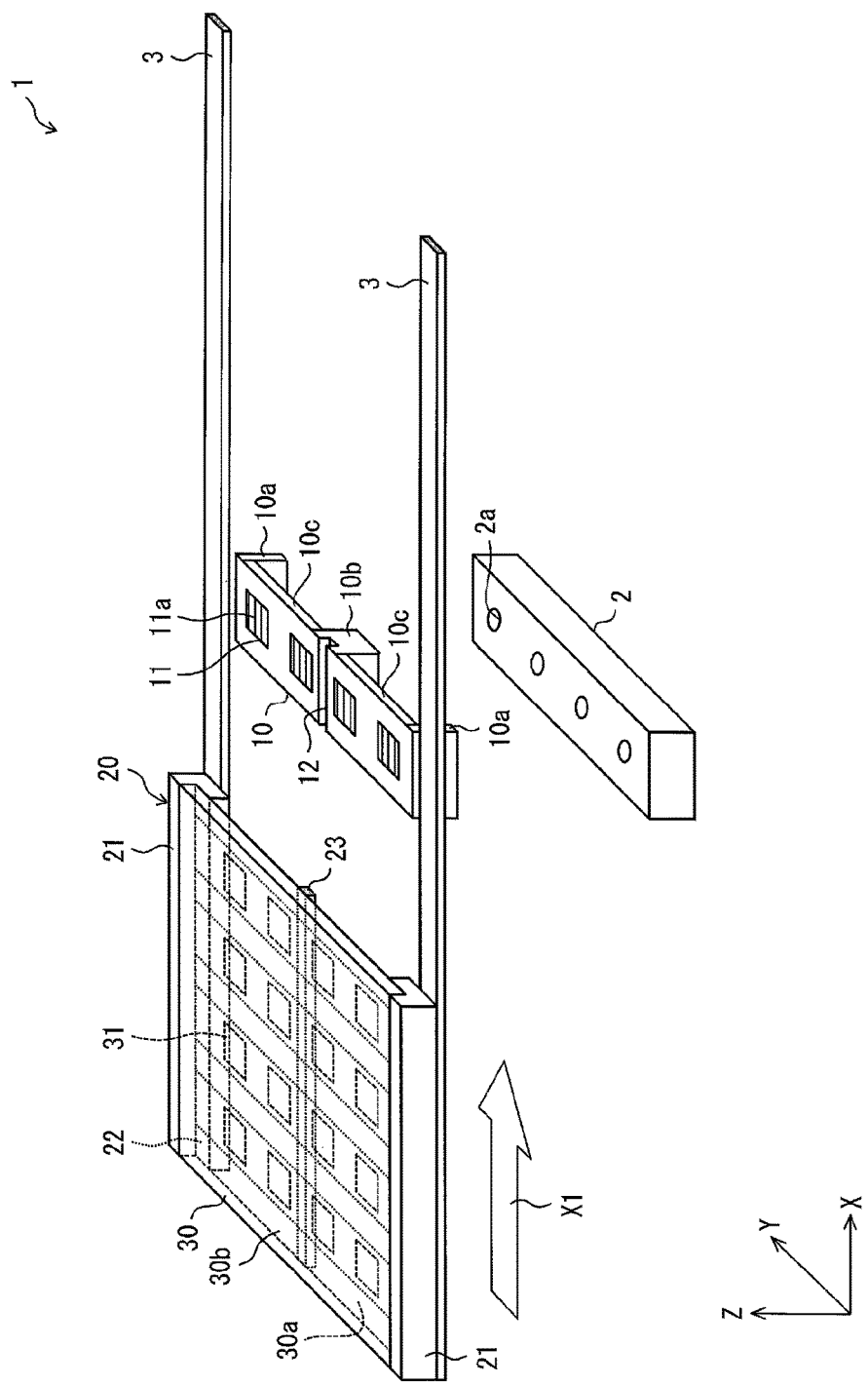
FIG. 4 is a perspective view illustrating a state where the vapor deposition target substrate is placed on the substrate tray in the vapor deposition device according to the first embodiment of the disclosure.

FIG. 4 is a perspective view illustrating a state where the vapor deposition target substrate 30 is placed on the vapor deposition device 1.

As illustrated in FIG. 4, an operator or a robot places the vapor deposition target substrate 30 on the substrate tray 20 with the vapor deposition target surface 30a facing the vapor deposition source 2 side (negative side in Z-axis direction).

At this time, the placing parts 21, 21 of the substrate tray 20 are put into contact with edges of the vapor deposition target surface 30a respectively at or near opposite sides of the vapor deposition target substrate 30 to support the vapor deposition target substrate 30.

The blocking parts 22 of the substrate tray 20 do not cover the display regions 31 on the vapor deposition target surface 30a, but cover the regions 30c adjacent to the display regions 31 in X-axis direction (see FIG. 2).

The crosspiece 23 does not cover the display regions 31 on the vapor deposition target surface 30a, but covers the region 30d adjacent to the display regions 31 in Y-axis direction (see FIG. 2).

Figure 20A:
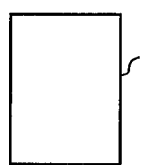
FIG. 20A illustrates a cross section of a crosspiece in Y-axis direction according to the first embodiment of the disclosure, in a case that the cross section is rectangular.
Figure 20B:
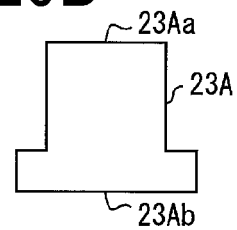
FIG. 20B is a diagram illustrating a case that the cross section has a shape wider on a mask side end of the crosspiece.

FIG. 20A illustrates a cross section of a crosspiece in Y-axis direction according to the first embodiment of the disclosure, in a case that the cross section is rectangular, and FIG. 20B is a diagram illustrating a case that the cross section has a shape wider on a mask side face of the crosspiece. The crosspiece 23 may have the cross section in Y-axis direction shaped in a rectangle as illustrated in FIG. 20A or a square. Further, the crosspiece 23 may have a shape like a crosspiece 23A as illustrated in FIG. 20B. The crosspiece 23A has a shape in which a width (length in Y-axis direction) of a mask side face 23Ab (face on a side closer to the vapor deposition mask 10, lower face) is larger than a width of a blocking part side face 23Aa (face on a side in contact with the blocking parts 22, upper face).

Figure 5:
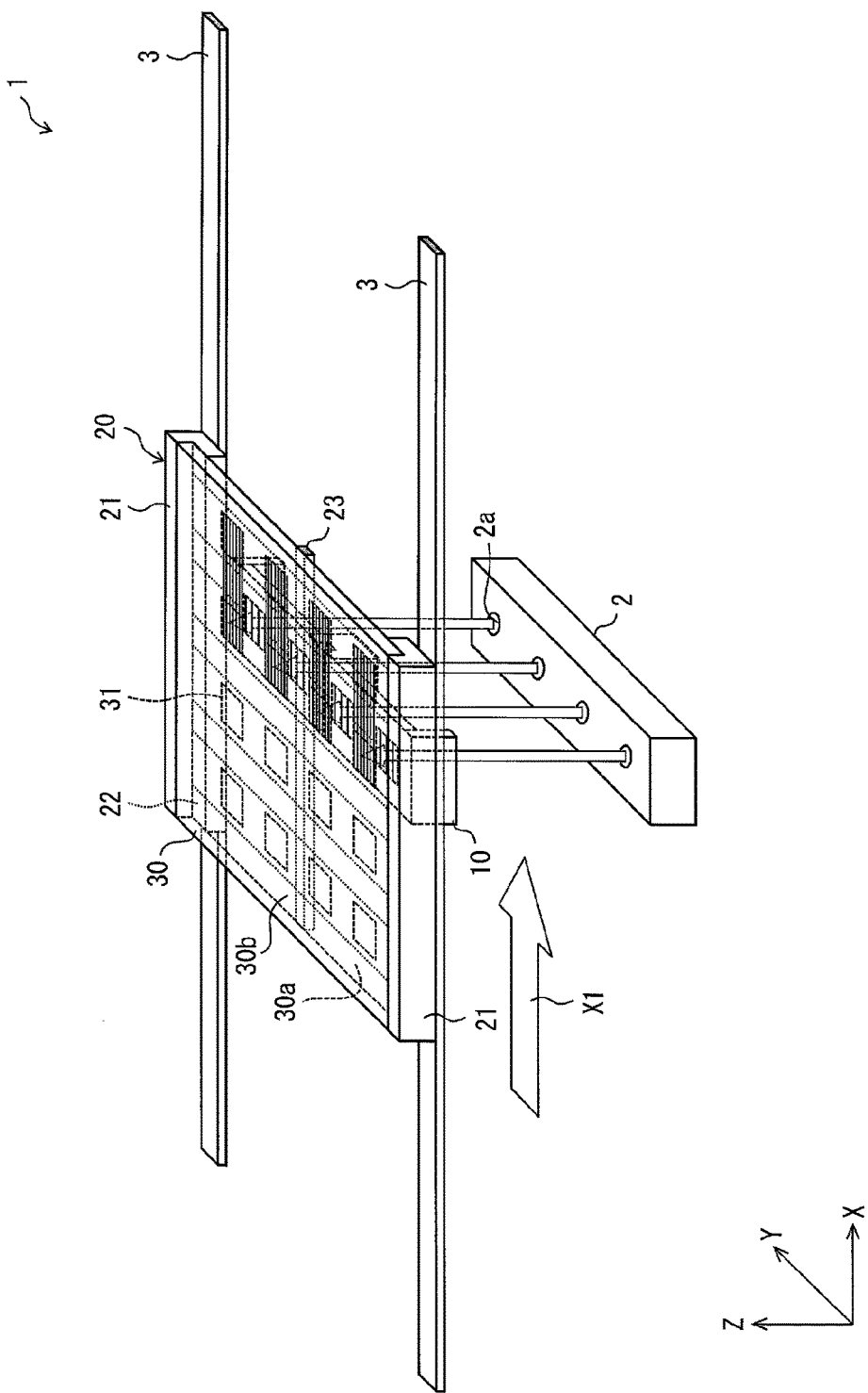
FIG. 5 is a perspective view illustrating a state where the vapor deposition target substrate placed on the vapor deposition device is subject to vapor deposition according to the first embodiment of the disclosure.
Figure 6:
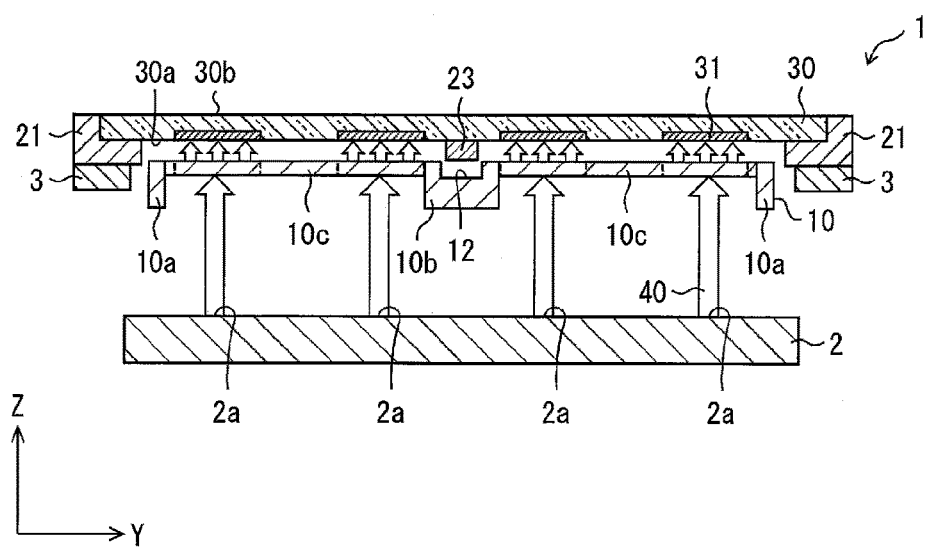
FIG. 6 is a diagram illustrating a cross section of the vapor deposition device in FIG. 5 in Y-axis direction.
Figure 7:
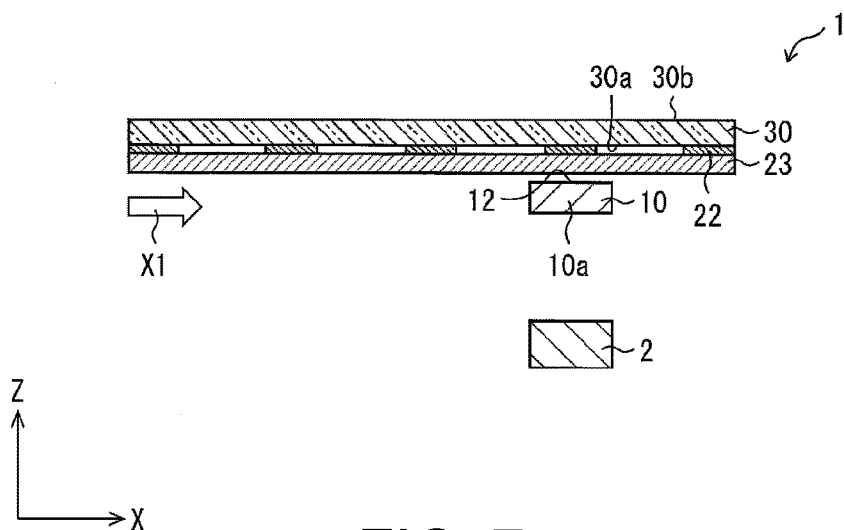
FIG. 7 is a diagram illustrating a cross section of the vapor deposition device in FIG. 5 in X-axis direction.
Figure 8:
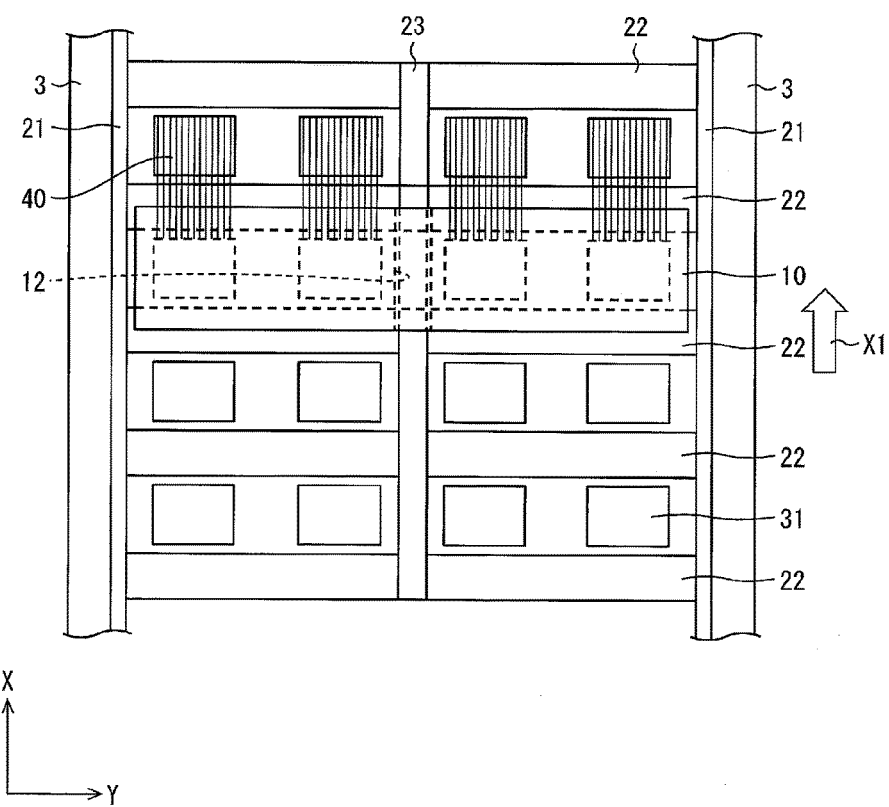
FIG. 8 is a plan view of a vapor deposition mask and a substrate tray in the vapor deposition device illustrated in FIG. 5, when viewed from a negative side to a positive side in Z-axis direction.

FIG. 5 is a perspective view illustrating a state in which the vapor deposition target substrate 30 placed on the vapor deposition device 1 is subject to vapor deposition. FIG. 6 is a diagram illustrating a cross section of the vapor deposition device 1 in FIG. 5 in Y-axis direction. FIG. 7 is a diagram illustrating a cross section of the vapor deposition device 1 in FIG. 5 in X-axis direction. FIG. 8 is a plan view of the vapor deposition mask and a substrate tray 20 in the vapor deposition device 1 illustrated in FIG. 5, when viewed from a negative side to a positive side in Z-axis direction.

As illustrated in FIG. 5 to FIG. 8, the substrate tray 20 travels in the scanning direction (direction illustrated by an arrow X1) to cause the vapor deposition target substrate 30 to travel above the vapor deposition mask 10 (first step) to be scanned. Vapor deposition particles 40 are emitted from the emission outlets 2a of the vapor deposition source 2 (second step). The vapor deposition particles 40 pass through the slits 11a of the vapor deposition mask 10.

Then, the substrate tray 20 travels and a region between the blocking parts 22 reaches above the slits 11a of the vapor deposition mask 10 (see FIG. 4), the vapor deposition particles 40 passing through the slits 11a of the vapor deposition mask 10 are deposited on a prescribed region in the vapor deposition target surface 30a of the vapor deposition target substrate 30 (a region of the pixel formation region row 33R, pixel formation region row 33G, or pixel formation region row 33B illustrated in FIG. 3).

In a case where any of the blocking parts 22 travels to above the slits 11a of the vapor deposition mask 10, the vapor deposition particles 40 passing through the slits 11a of the vapor deposition mask 10 adhere to the blocking part 22. In other words, the blocking parts 22 block the vapor deposition particles 40 from adhering to the regions 30c adjacent to the display regions 31 in X-axis direction on the vapor deposition target surface 30a.

This prevents the vapor deposition particles 40 from being deposited on the regions 30c adjacent to the display regions 31 in X-axis direction on the vapor deposition target surface 30a, even in a case of performing the scan vapor deposition.

The crosspiece 23 does not cover the display regions 31 on the vapor deposition target surface 30a, but covers the region adjacent to the display regions 31 in Y-axis direction. For this reason, the vapor deposition particles 40 to be deposited on the display regions 31 would not be blocked by the crosspiece 23.

The crosspiece 23 covers the region adjacent to the display regions 31 in Y-axis direction on the vapor deposition target surface 30a, and therefore, prevents the vapor deposition particles 40 from being deposited on the region with more certainty, in addition to blocking by the vapor deposition mask 10.

The crosspiece 23 enters the recessed portion 12 at a prescribed distance from a bottom face of the recessed portion 12 and passes through the recessed portion 12. This prevents the crosspiece 23 from contacting with the vapor deposition mask 10 while performing the scan vapor deposition.

Therefore, even in a case where the crosspiece 23 is arranged at the substrate tray 20, a distance from the vapor deposition target substrate 30 to the vapor deposition mask 10 is reduced. This allows the vapor deposition particles 40 to be deposited on the vapor deposition target surface 30a with accuracy.

Figure 9:
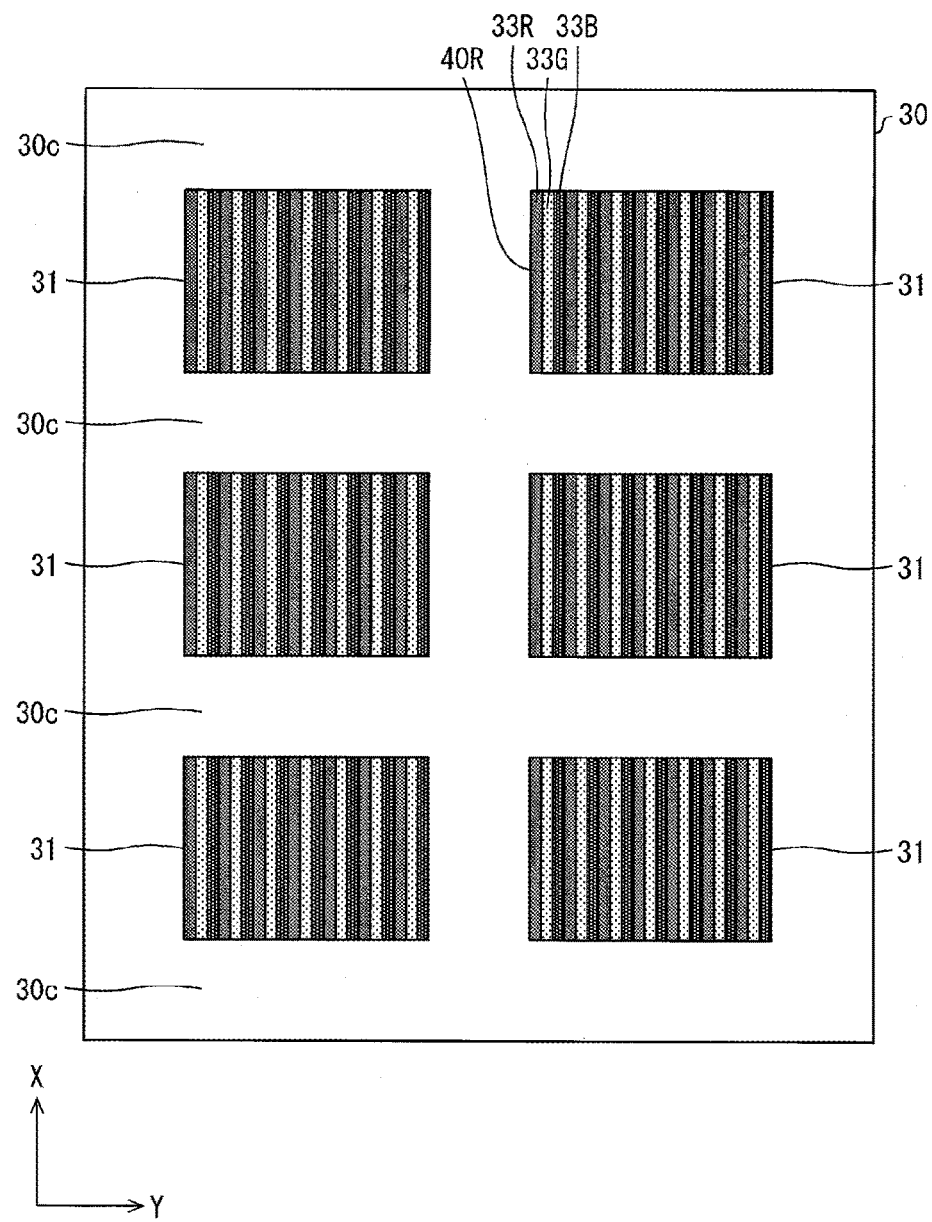
FIG. 9 is a plan view illustrating a vapor deposition target surface of a vapor deposition target substrate having been subjected to vapor deposition by the vapor deposition device according to the first embodiment of the disclosure.

FIG. 9 is a plan view illustrating the vapor deposition target surface 30a of the vapor deposition target substrate 30 having been subjected to vapor deposition by the vapor deposition device 1. As illustrated in FIG. 9, an organic EL layer 40R emitting red light is deposited, as the vapor deposition particles 40 (see FIG. 5), on the pixel formation region rows 33R in the respective display regions 31, as an example. Then, on the regions 30c adjacent to the display regions 31 in X-axis direction having been covered with the blocking parts 22, the organic EL layer 40R is not deposited.

Therefore, circuit components, such as terminals, that fail due to adhesion of the organic EL layer to the circuit components can also be arranged on the regions 30c adjacent to the display regions 31 in X-axis direction on the vapor deposition target surface 30a of the vapor deposition target substrate 30.

Therefore, as compared to a case where the vapor deposition is performed by use of a vapor deposition device in a scan vapor deposition method of the related art, the vapor deposition using the vapor deposition device 1 improves a degree of freedom in designing the vapor deposition target substrate 30. In other words, according to the vapor deposition device 1, a degree of freedom in designing is prevented from being restricted even in a case of performing the scan vapor deposition.

Moreover, the vapor deposition particles 40 would not be deposited on the region adjacent to the display regions 31 in Y-axis direction, in the vapor deposition target surface 30a covered with the crosspiece 23.

Figure 10:
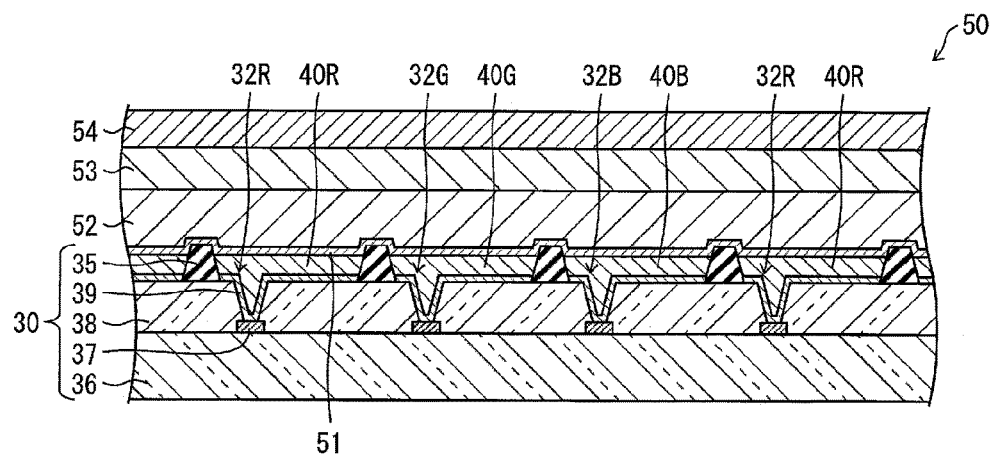
FIG. 10 is a cross-sectional view illustrating a configuration of an organic EL display that is produced with the vapor deposition target substrate having been subjected to vapor deposition by the vapor deposition device according to the first embodiment of the disclosure.

FIG. 10 is a cross-sectional view illustrating a configuration of an organic EL display 50, which is produced with the vapor deposition target substrate 30.

The vapor deposition target substrate 30 includes at least a glass substrate 36, a TFT element 37, an interlayer insulating film 38, a lower electrode 39, and the edge cover 35.

Various functional films are layered on the glass substrate 36, and then, on the glass substrate 36, the TFT element 37 is formed for each pixel via the functional films. The TFT element 37 drives each pixel.

The interlayer insulating film 38 covers the TFT element 37 and is layered on the entire surface of the glass substrate 36. A contact hole is formed, on the TFT element 37, in the interlayer insulating film 38. The interlayer insulating film 38 can be formed by applying organic materials including a photosensitive resin such as acrylic, or polyimide, and then can be patterned by a photolithographic method or the like.

The lower electrodes 39 are formed on the interlayer insulating film 38 in the pixel formation regions 32R, 32G, and 32B. The lower electrode 39 is connected with the TFT element 37 via the contact hole formed in the interlayer insulating film 38.

The edge cover 35 is formed on the interlayer insulating film 38 and surrounds edges of the lower electrode 39. A region surrounded by the edge cover 35 corresponds to each of the pixel formation regions 32R, 32G, and 32B. That is, the edge cover 35 surrounds each of the pixel formation regions 32R, 32G, and 32B. Further, in other words, each of the pixel formation regions 32R, 32G, and 32B serves as a recessed portion defined by the edge cover 35.

The edge cover 35 prevents the edge of the lower electrode 39 from short-circuiting an upper electrode due to electrode concentration or an organic EL layer that has become thinner. The edge cover 35 is also provided to prevent electric field concentration at the edge of the lower electrode 39. This prevents a reduction in quality of the organic EL layer.

On such a vapor deposition target substrate 30, by using the vapor deposition device 1, the organic EL layer 40R for emitting red light is formed on the pixel formation region 32R by the vapor deposition, the organic EL layer 40G for emitting green light is formed on the pixel formation region 32G by the vapor deposition, and the organic EL layer 40B for emitting blue light is formed on the pixel formation region 32B by the vapor deposition.

Note that a hole injecting layer, a hole transport layer, an electron transport layer, an electron injecting layer and the like may be formed on an upper layer or lower layer of the organic EL layers 40R, 40G, and 40B, as appropriate. One layer may have multiple functions. For example, a hole injection-cum-transport layer having a function of both the hole injecting layer and the hole transport layer may be formed in place of the hole injecting layer and the hole transport layer. An electron injection-cum-transport layer having a function of both the electron injecting layer and the electron transport layer may be formed in place of the electron injecting layer and the electron transport layer. A carrier blocking layer may be provided between the layers, as appropriate.

Next, an upper electrode 51 is formed on the entire surface to cover the organic EL layers 40R, 40G, and 40B and the edge cover 35.

In this manner, the pixels including the organic EL layers 40R, 40G, and 40B are configured. The upper electrode 51 may be formed in an island shape for each pixel.

Then, a sealing layer 52 is formed to cover the entire surface of the upper electrode 51. The sealing layer 52 may be formed in a three-layered structure of an inorganic film, an organic film, and an inorganic film that are layered in this order, or may be formed by layering four or more layers of an inorganic layer(s) and an organic layer(s), for example.

The sealing layer 52 planarizes and seals the organic EL layers 40R, 40G, and 40B to prevent a reduction in quality of the organic EL layers 40R, 40G, and 40B caused by moisture or oxygen that has entered from outside.

Next, an adhesive layer 53 is formed on the sealing layer 52, and a transparent film 54 is attached to the sealing layer 52 with the adhesive layer 53 interposed between the sealing layer 52 and the transparent film 54. This completes the organic EL display device 50. Note that a touch panel may be attached in place of the transparent film 54, or may be attached on the transparent film 54.

In this way, the method for producing the organic EL display device 50 includes depositing, by the vapor deposition device 1, the vapor deposition particles 40 on the pixel formation regions 32R, 32G, and 32B to form the pixels including the organic EL layers 40R, 40G, and 40B. This makes it possible to produce the organic EL display device 50 from the vapor deposition target substrate 30, by which a degree of freedom in designing is prevented from being restricted even in a case of performing the scan vapor deposition.

Second Embodiment

Figure 11:
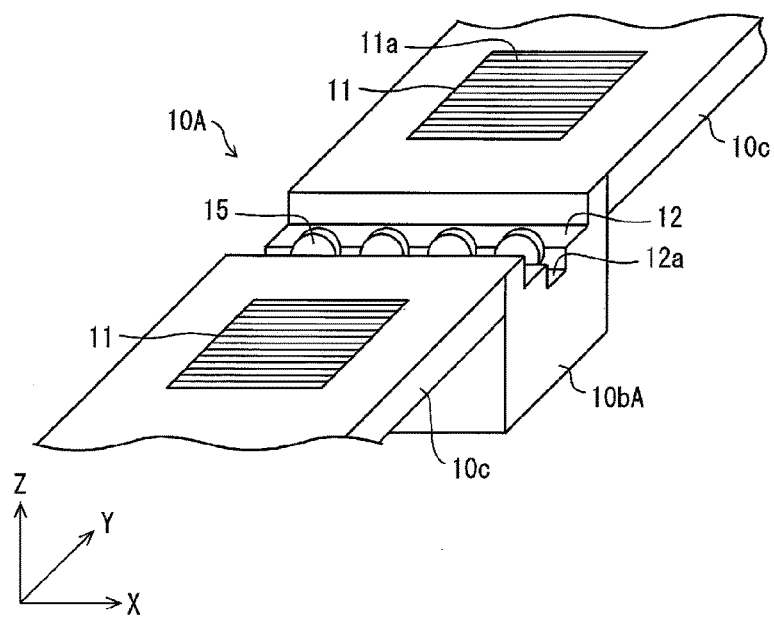
FIG. 11 is a perspective view illustrating a configuration of a vapor deposition mask included in a vapor deposition device according to a second embodiment of the disclosure.
Figure 12:
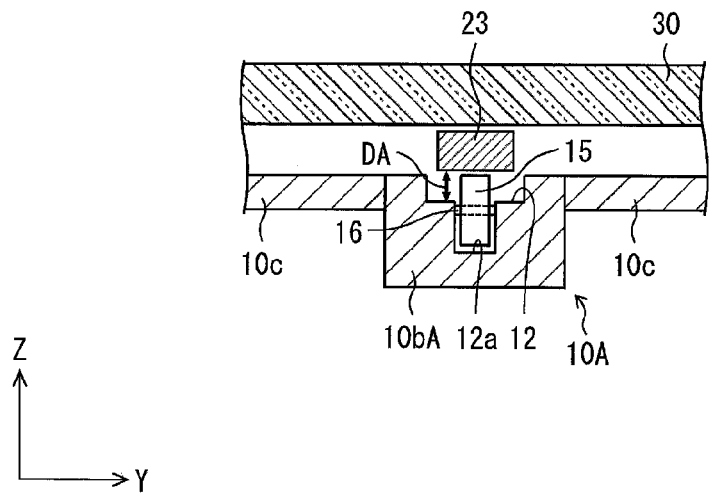
FIG. 12 is a substantial part cross-sectional view of the vapor deposition device according to the second embodiment of the disclosure in X-axis direction in a case where a vapor deposition target substrate is passing over the vapor deposition mask.
Figure 13:
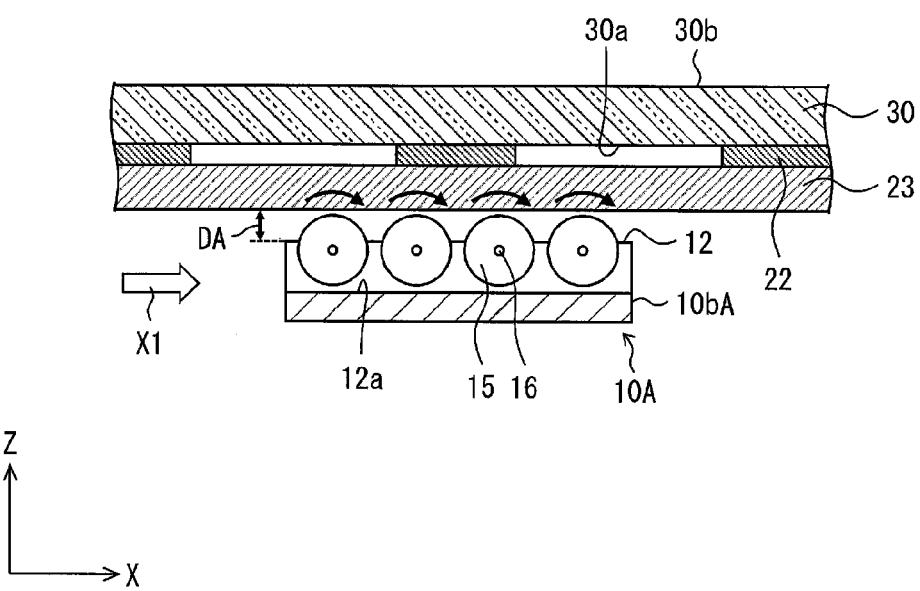
FIG. 13 is a substantial part cross-sectional view of the vapor deposition device according to the second embodiment of the disclosure in Y-axis direction in a case where the vapor deposition target substrate is passing over the vapor deposition mask.

A description follows regarding a second embodiment of the disclosure, with reference to FIGS. 11 to 13. For the sake of the description, components having the same functions as the components stated in the first embodiment are appended with the same reference signs, and the description thereof is omitted.

FIG. 11 is a perspective view illustrating a configuration of a vapor deposition mask included in a vapor deposition device according to the second embodiment of the disclosure. FIG. 12 is a substantial part cross-sectional view of the vapor deposition device according to the second embodiment of the disclosure in X-axis direction in a case where a vapor deposition target substrate is passing over the vapor deposition mask. FIG. 13 is a substantial part cross-sectional view of the vapor deposition device according to the second embodiment of the disclosure in Y-axis direction in a case where the vapor deposition target substrate is passing over the vapor deposition mask.

As illustrated in FIG. 11, the vapor deposition device 1 (see FIG. 4, etc.) may include a vapor deposition mask 10A in place of the vapor deposition mask 10.

The vapor deposition mask 10A is different from the vapor deposition mask 10 (see FIG. 4, etc.) in that a mask center frame part 10bA in which roller members 15 are arranged in place of the mask center frame part 10b. Other configurations of the vapor deposition mask 10A are similar to the vapor deposition mask 10.

As illustrated in FIG. 11, a groove 12a extending in X-axis direction is formed on a bottom face of the recessed portion 12 of the mask center frame part 10bA. The roller members 15 are arranged in alignment to be apart from each other in X-axis direction with the roller members 15 partially inserted in the groove 12a.

As illustrated in FIG. 12 and FIG. 13, shafts 16 to be coupled with both side faces of the groove 12a are arranged in align to be apart from each other in the groove 12a in X-axis direction. The roller members 15 are arranged to be partially within the groove 12a and to be partially exposed from the groove 12a (exposed from the bottom face of the recessed portion 12) with its corresponding shaft 16 being a rotation axis.

When the vapor deposition target substrate 30 placed on the substrate tray 20 (see FIG. 4, etc.) travels in X-axis direction, the roller members 15 are put into contact with the lower face of the crosspiece 23 and rotate about the shaft 16 as the rotation axis, as illustrated by an arrow θX in FIG. 13.

In this way, while performing the scan vapor deposition, the crosspiece 23 and the roller members 15 are in contact with each other and the roller members rotate. This allows the crosspiece 23 to smoothly pass through the recessed portion 12.

As the roller members 15, multiple roller members are arranged in an extending direction of the recessed portion 12 (X-axis direction), and therefore a distance DA from the crosspiece 23 to the bottom face of the recessed portion 12 can be kept constant while performing the scan vapor deposition. This prevents the crosspiece 23 from contacting with the bottom face of the recessed portion 12.

Note that multiple roller members 15 may not be necessarily arranged, but only one roller member 15 may be arranged at the bottom face of the recessed portion 12. The shape of the roller members 15 illustrated in FIG. 11 to FIG. 13 is an example, and may have a shape to be rotatable in accordance with a traveling direction of the crosspiece 23 when the roller members 15 are put into contact with the crosspiece 23. For example, the roller members 15 may have another shape, such as a spherical shape, different from a disc shape.

Third Embodiment

Figure 14:
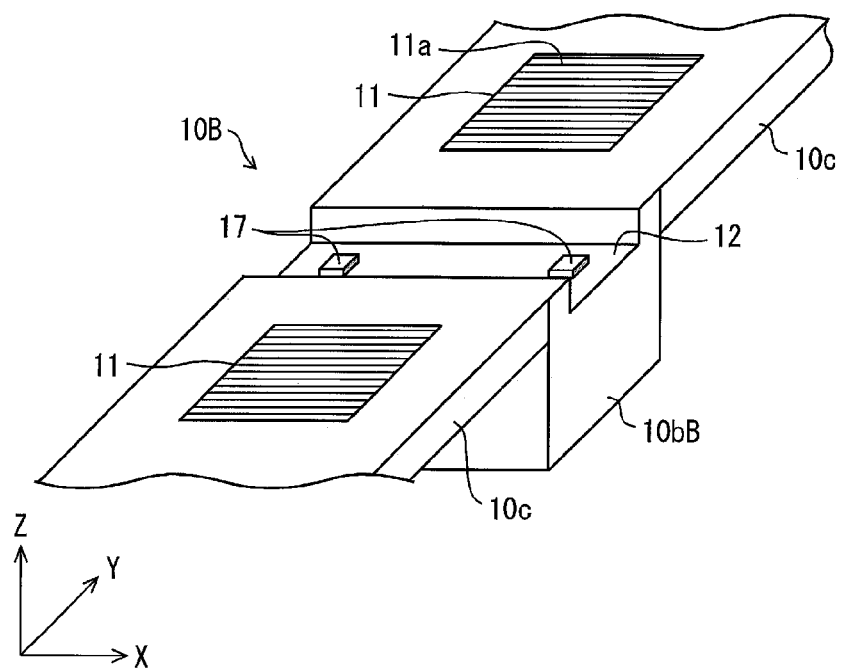
FIG. 14 is a perspective view illustrating a configuration of a vapor deposition mask included in a vapor deposition device according to a third embodiment of the disclosure.
Figure 15:
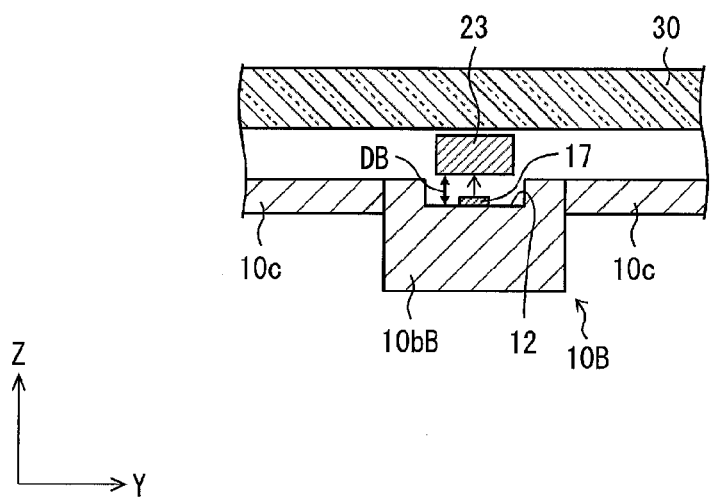
FIG. 15 is a substantial part cross-sectional view of the vapor deposition device according to the third embodiment of the disclosure in X-axis direction in a case where a vapor deposition target substrate is passing over the vapor deposition mask.
Figure 16:
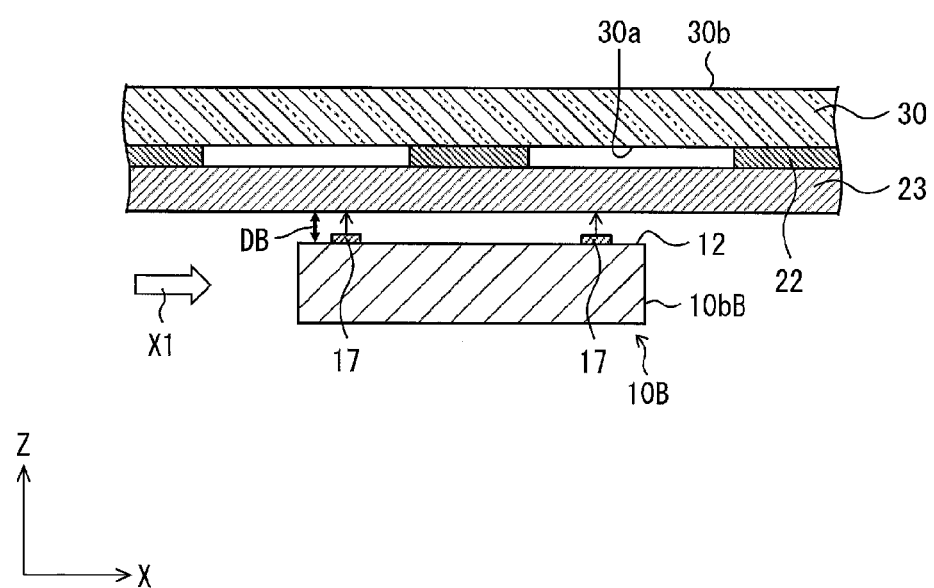
FIG. 16 is a substantial part cross-sectional view of the vapor deposition device according to the third embodiment of the disclosure in Y-axis direction in a case where the vapor deposition target substrate is passing over the vapor deposition mask.
Figure 17:
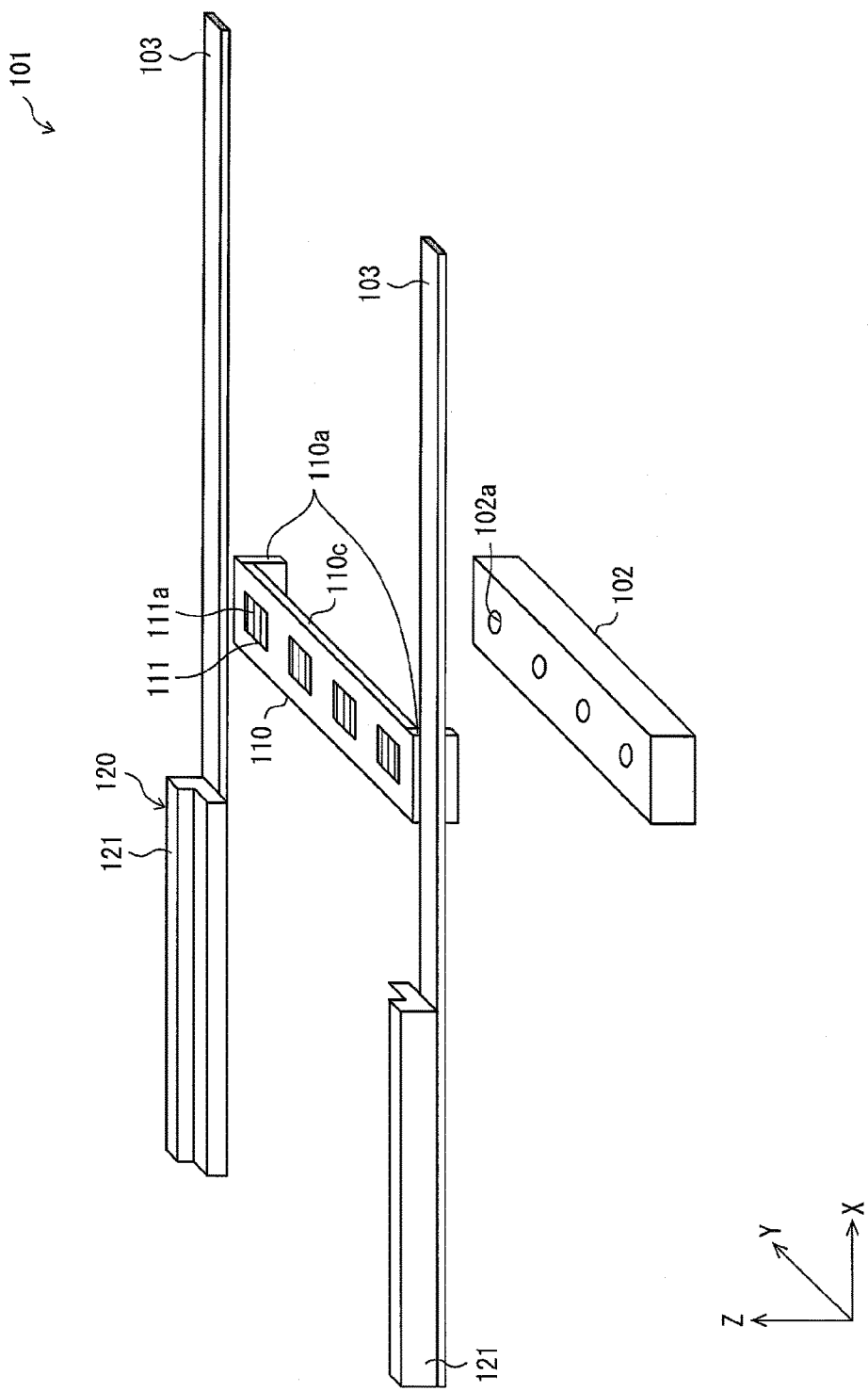
FIG. 17 is a perspective view illustrating a configuration of a vapor deposition device of the related art.
Figure 18:
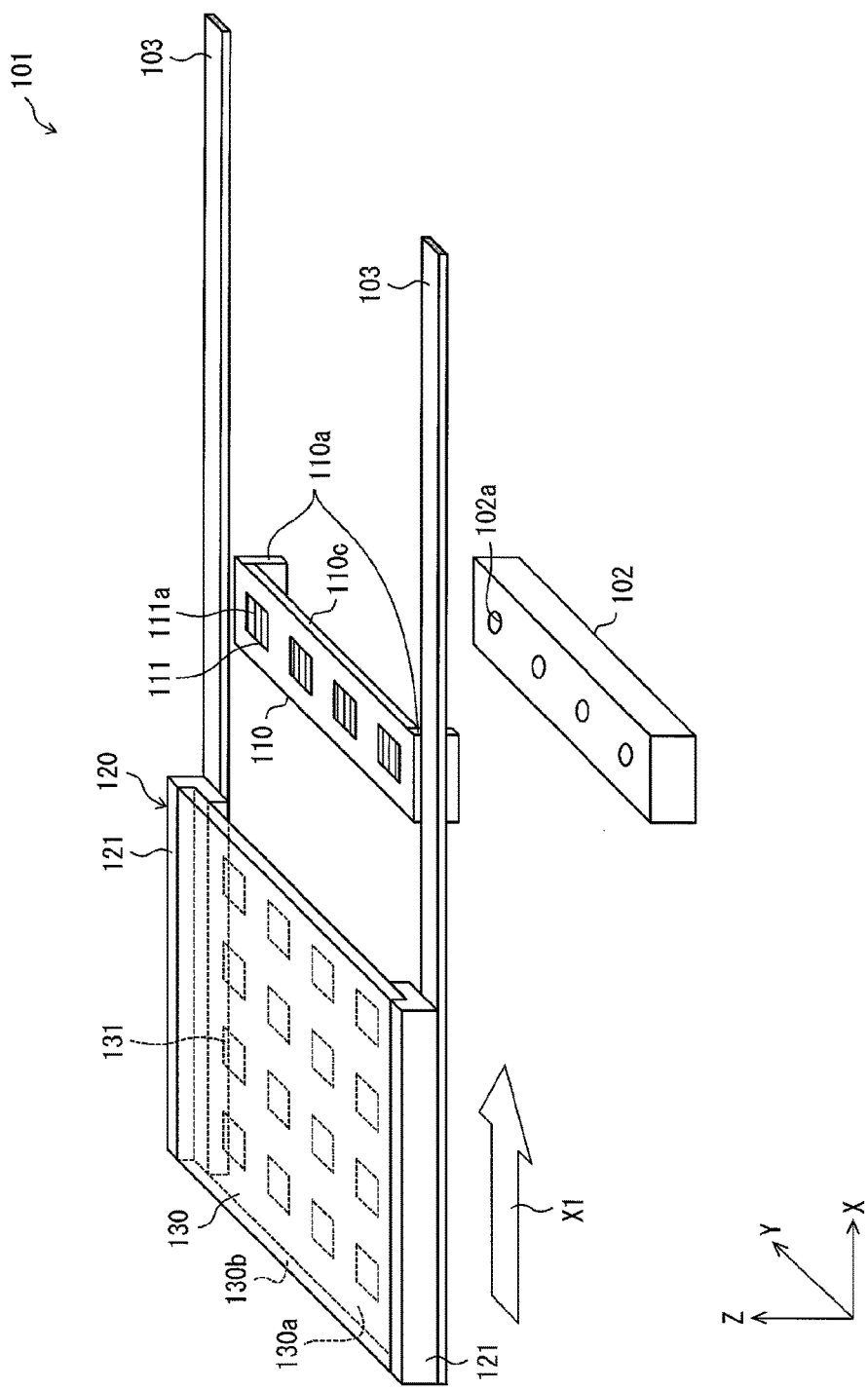
FIG. 18 is a diagram illustrating a state where vapor deposition is started in the vapor deposition device of the related art.
Figure 19:
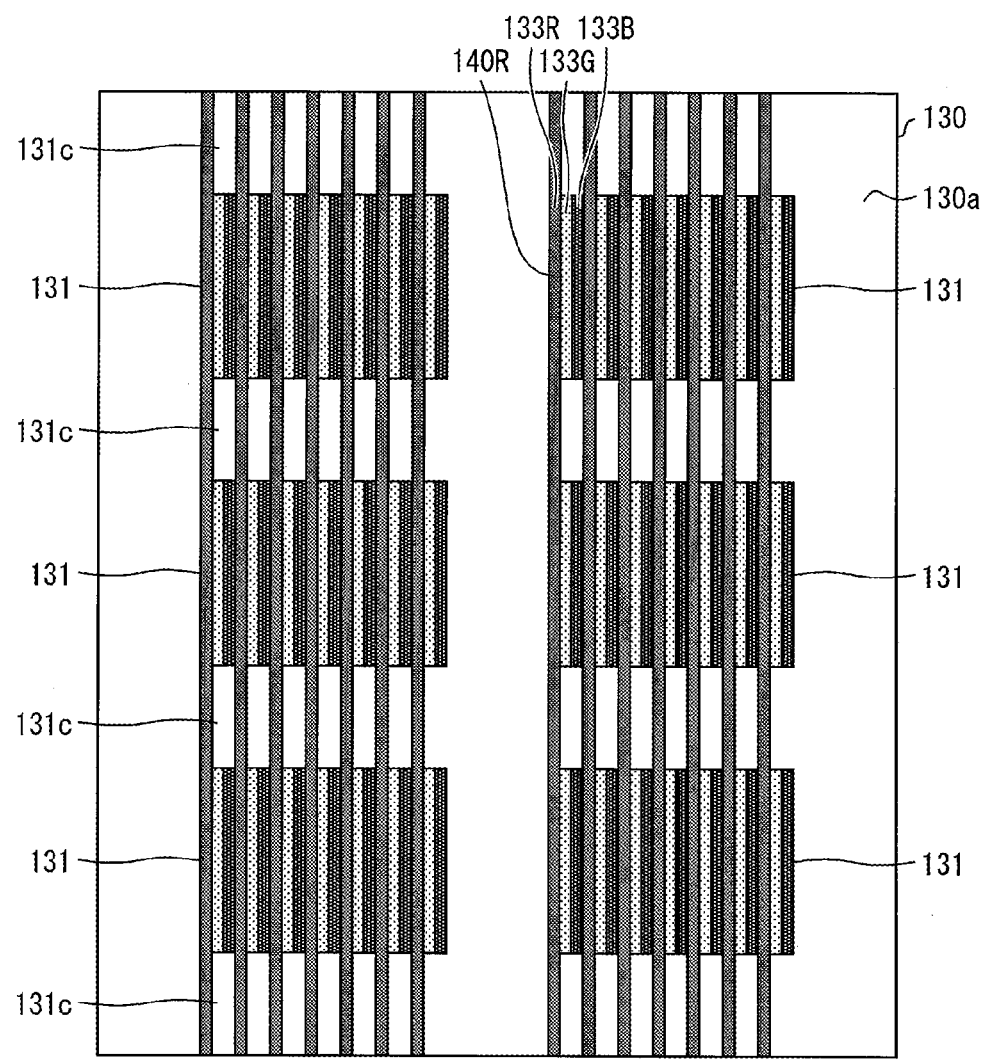
FIG. 19 is a diagram illustrating a state of a vapor deposition target surface of a vapor deposition target substrate on which vapor deposition particles are deposited by the vapor deposition device of the related art.

A description follows regarding a third embodiment of the disclosure, with reference to FIGS. 14 to 16. For the sake of the description, components having the same functions as the components stated in the first and second embodiments are appended with the same reference signs and the description thereof is omitted.

FIG. 14 is a perspective view illustrating a configuration of a vapor deposition mask included in a vapor deposition device according to the third embodiment of the disclosure. FIG. 15 is a substantial part cross-sectional view of the vapor deposition device according to the third embodiment of the disclosure in X-axis direction in a case where a vapor deposition target substrate is passing over a vapor deposition mask. FIG. 16 is a substantial part cross-sectional view of the vapor deposition device according to the third embodiment of the disclosure in Y-axis direction in a case where the vapor deposition target substrate is passing over the vapor deposition mask.

As illustrated in FIG. 14, the vapor deposition device 1 (see FIG. 5, etc.) may include a vapor deposition mask 10B in place of the vapor deposition mask 10.

The vapor deposition mask 10B is different from the vapor deposition mask 10 (see FIG. 4, etc.) in that a mask center frame part 10bB includes a sensor 17 for measuring a distance is arranged in place of the mask center frame part 10b. Other configurations of the vapor deposition mask 10B are similar to the vapor deposition mask 10.

As illustrated in FIG. 14, the sensors for measuring distances are arranged on a bottom face of the recessed portion 12 of the mask center frame part 10bB in alignment to be apart by a prescribed interval from each other in X-axis direction.

As illustrated in FIG. 15 and FIG. 16, when the vapor deposition target substrate 30 placed on the substrate tray 20 (see FIG. 4, etc.) travels in X-axis direction and the crosspiece 23 enters the recessed portion 12, the sensor 17 measures a distance from the sensor 17 to a lower face of the crosspiece 23. Then, the sensor 17 measures a distance DB from the bottom face of the recessed portion 12 to the crosspiece 23 including a thickness of the sensor 17.

In this way, the use of the sensor 17 to recognize the distance DB from the crosspiece 23 passing through the recessed portion to the bottom face of the recessed portion 12. This can prevent the crosspiece 23 from contacting with the bottom face of the recessed portion 12.

The distance DB from the crosspiece 23 to the bottom face of the recessed portion 12 measured by the sensors 17 may be displayed on, for example, a display device, not illustrated. In a case that the distance DB from the crosspiece 23 to the bottom face of the recessed portion 12 measured by the sensor 17 is less than a prescribed value, the controller, not illustrated, may stop scanning the vapor deposition target substrate 30.

Note that the number of the sensors 17 may not be specifically limited, but may be one, or three or more.

Fourth Embodiment

A description follows regarding a fourth embodiment of the disclosure, with reference to FIG. 21A to FIG. 21D. For the sake of the description, components having the same functions as the components stated in the first to third embodiments are appended with the same reference signs, and the description thereof is omitted.

FIG. 21A is a side view illustrating a state of a crosspiece according to the fourth embodiment of the disclosure, and illustrates a state where both ends of the crosspiece are polarized, FIG. 21B illustrates a state where inner side portions of both ends are polarized, FIG. 21C illustrates a state where a portion between both ends is polarized alternately to S poles and N poles, and FIG. 21D is a diagram illustrating a portion between inner side portions of both ends is polarized alternately to S poles and N poles.

The crosspiece 23 (see FIG. 4, etc.), as illustrated by crosspieces 23B to 23E in FIG. 21A to FIG. 21D, may include a portion made of a magnetic material or a magnet to be partly or generally polarized to an S pole and an N pole.

In each of the crosspieces 23B to 23E, both ends opposite to each other in an extending direction are called a first end 23a and a second end 23b.

In the crosspiece 23B illustrated in FIG. 21A, a region including the first end 23a is a first region (polarized region) 60N polarized to an N pole, a region including the second end 23b is a second region (polarized region) 60S polarized to an S pole, and a region between the N pole region 60N and the S pole region 60S is a third region 61 not polarized. This allows the mask center frame part 10b, and the first region 60N and second region 60S of the vapor deposition mask 10 to magnetically attract each other, particularly in a case that the mask center frame part 10b includes an Inver material. This decreases a distance from the vapor deposition mask 10 to the crosspiece 23 to prevent vapor deposition blur. In other words, the vapor deposition is enabled with accuracy.

The polarized first region 60N and second region 60S may be made of a magnetic material or a magnet, or may be configured by arranging one or more magnets in each region and covering the outer side of the magnets by an Invar material or the like.

The configuration may be made such that, as the crosspiece 23C illustrated in FIG. 21B, the first region 60N is arranged at an inner side of the first end 23a by a prescribed distance so that a region from one end of the first region 60N to the first end 23a is the third region 61, the second region 60S is arranged at an inner side of the second end 23b by a prescribed distance so that a region from one end of the second region 60S to the second end 23b is the third region 61, and a region from the other end of the first region 60N to the other end of the second region 60S is the third region 61.

The configuration may be made such that, as the crosspiece 23D illustrated in FIG. 21C, the first region 60N and the second region 60S are alternately arranged from the first end 23a to the second end 23b, and the third region 61 is not arranged.

The configuration may be made such that, as the crosspiece 23E illustrated in FIG. 21D, the first region 60N and the second region 60S are alternately arranged, the third region 61 is arranged between the outermost first region 60N and the first end 23a, and the third region 61 is arranged between the outermost second region 60S and the second end 23b.

Further, in the vapor deposition device 1 (see FIG. 4, etc.), the crosspiece 23 may be replaced with any of the crosspieces 23B to 23E respectively illustrated in FIG. 21A to FIG. 21D, and the vapor deposition mask 10 may be replaced with the vapor deposition mask 10A illustrated in FIG. 11 to FIG. 13, or the vapor deposition mask 10B illustrated in FIG. 14 to FIG. 16.

In a case that the first region 60N and the second region 60S are made of an electric magnet, an entering detection sensor for detecting whether the crosspiece 23 enters may be provided in the recessed portion 12 of the vapor deposition mask 10. Therefore, for example, before the crosspiece 23C enters the recessed portion 12, the crosspiece 23C is not polarized. After the entering detection sensor detects that the crosspiece 23C enters the recessed portion 12, that is, after the crosspiece 23C enters the recessed portion 12, the first region 60N and the second region 60S can be formed in the crosspiece 23C. The magnetic force when the crosspiece 23C enters the recessed portion 12 prevents a collision of the crosspiece 23C and the vapor deposition mask 10.

Supplement

According to a first aspect of the disclosure, as described above, a vapor deposition device 1 includes a vapor deposition mask 10, a vapor deposition source 2 configured to emit vapor deposition particles 40 toward the vapor deposition mask 10, and a substrate tray 20, on which a vapor deposition target substrate 30 is placed, the substrate tray 20 being configured to cause the vapor deposition target substrate 30 to perform a relative movement with respect to the vapor deposition mask 10. On the vapor deposition target surface 30a of the vapor deposition target substrate 30, the display regions 31 are provided in alignment to be apart from each other in a direction (X-axis direction) parallel with a direction of the relative movement, and the pixel formation regions 32R, 32G, and 32B, on which the vapor deposition particles are to be deposited are arranged in a matrix in each of the display regions 31 The substrate tray 30 includes a blocking part 22 configured to block the vapor deposition particles 40 to be deposited onto the regions 31c adjacent to the display regions 31 in the direction (X-axis direction) parallel with the direction of the relative movement.

According to the above configuration, the substrate tray relatively moves with respect to the vapor deposition mask, on which the vapor deposition target substrate is placed, and thus the scan vapor deposition is enabled.

The substrate tray includes the blocking part 22 configured to block the vapor deposition particles 40 to be deposited onto the regions 30c adjacent to the display regions in the direction (X-axis direction) parallel with the direction of the relative movement on the vapor deposition target surface of the vapor deposition target substrate.

This prevents the vapor deposition particles from depositing onto the regions adjacent to the display regions in the direction (X-axis direction) parallel with the direction of the relative movement on the vapor deposition target surface of the vapor deposition target substrate, even in performing the scan vapor deposition.

Therefore, circuit components to be failed due to adhesion of the vapor deposition particles can be arranged on a region adjacent to the display regions in the direction (X-axis direction) parallel with the direction of the relative movement, on the vapor deposition target surface of the vapor deposition target substrate.

Accordingly, a limitation in degree of freedom in designing the vapor deposition target substrate is prevented even in performing the scan vapor deposition.

In the vapor deposition device 1 according to a second aspect of the disclosure, in the above first aspect, the one blocking part 22 may cover the region 30c adjacent to the display region 31 in the direction (X-axis direction) parallel with the direction of the relative movement on the vapor deposition target surface 30a.

The above configuration allows the blocking part to block the vapor deposition particles to be deposited onto the region adjacent to the display regions in the direction parallel with the direction of the relative movement on the vapor deposition target substrate.

In the vapor deposition device 1 according to a third aspect of the disclosure, in the above first or second aspect, a plurality of blocking parts 22 may be arranged in alignment in the direction (X-axis direction) parallel with the direction of the relative movement of the vapor deposition target substrate 30, and the substrate tray 20 may further include a bar-shaped member (crosspiece 23) for coupling the plurality of blocking parts 22 with each other.

The above configuration prevents the plurality of blocking parts from deforming. This prevents the plurality of blocking parts from contacting with the vapor deposition mask.

In the vapor deposition device 1 according to a fourth aspect of the disclosure, in the above third aspect, the bar-shaped member (crosspiece 23) may cover the region adjacent to the display regions 31 in the direction perpendicular to the direction of the relative movement (Y-axis direction) on the vapor deposition target surface 30a.

The above configuration prevents the vapor deposition particles to be deposited on the display regions from being blocked by the bar-shaped member. The bar-shaped member covers the region adjacent to the display regions in the direction perpendicular to the direction of the relative movement on the vapor deposition target surface, and therefore the vapor deposition particles are prevented from being deposited on the relevant region with more certainty.

In the vapor deposition device 1 according to a fifth aspect of the disclosure, in either the above third or fourth aspect, a recessed portion 12 may be provided on the vapor deposition mask 10, and may allow the bar-shaped member (crosspiece 23) to enter and pass through the recessed portion 12 when the vapor deposition target substrate 30 performs the relative movement.

The above configuration prevents the bar-shaped member from contacting the vapor deposition mask while performing the scan vapor deposition. Therefore, even in a case where the bar-shaped member is provided in the substrate tray, a distance between the vapor deposition target substrate and the vapor deposition mask is reduced. This allows the vapor deposition particles to be deposited on the vapor deposition target surface with accuracy.

In the vapor deposition device 1 according to a sixth aspect of the disclosure, in the above fourth aspect, the roller member 15 may be arranged at a bottom face of the recessed portion 12 of the vapor deposition mask 10A, the roller member 15 being configured to contact the bar-shaped member (crosspiece 23) to rotate while the vapor deposition target substrate 30 is performing the relative movement.

According to the above configuration, while performing the scan vapor deposition, the bar-shaped member and the roller member are in contact with each other, and the roller member rotates. This allows the bar-shaped member to smoothly pass through the recessed portion. The roller member allows a distance between the bar-shaped member and the bottom face of the recessed portion to be kept constant, and therefore prevents the bar-shaped member from contacting with the bottom face of the recessed portion.

In the vapor deposition device 1 according to a seventh aspect of the disclosure, in the above fourth aspect, a sensor 17 may be arranged on the bottom face the recessed portion 12 of the vapor deposition mask 10, the sensor 17 being configured to measure a distance between the bar-shaped member (crosspiece 23) and the bottom face of the recessed portion 12 of the vapor deposition mask 10 while the vapor deposition target substrate 30 is performing the relative movement.

The above configuration, the sensor obtains the distance between the bar-shaped member to pass through the recessed portion and the bottom face of the recessed portion. This prevents the bar-shaped member from contacting with the bottom face of the recessed portion.

In the vapor deposition device 1 according to an eighth aspect of the disclosure, in any one of the above third to sixth aspects, the bar-shaped member (crosspieces 23B to 23E) may include a polarized region (first region 60N, second region 60S) to be polarized. The above configuration allows the bar-shaped member and the vapor deposition mask to magnetically attract each other. This makes it possible to decrease a distance between the vapor deposition mask and the bar-shaped member to prevent the vapor deposition blur. In other words, the vapor deposition is enabled with accuracy.

In the vapor deposition device 1 according to a ninth aspect of the disclosure, in the above eighth aspect, after the bar-shaped member enters the recessed portion of the vapor deposition mask, the polarized region may be provided. The above configuration prevents a collision between the vapor deposition mask and the bar-shaped member due to a magnetic force when the vapor deposition mask enters the recessed portion.

A method for producing an organic EL display device 50 according to a tenth aspect of the disclosure, includes a first step of causing the substrate tray 20, on which a vapor deposition target substrate is placed, to perform a relative movement with respect to the vapor deposition mask 10, and a second step of emitting the vapor deposition particles 40 from the vapor deposition source 2 toward the vapor deposition mask 10. On the vapor deposition target surface 30a of the vapor deposition target substrate 30, the display regions 31 are provided in alignment to be apart from each other in a direction parallel with a direction of the relative movement, and the pixel formation regions 32R, 32G, and 32B on which the vapor deposition particles are to be deposited are provided in a matrix in each of the display regions 31. In the first step and the second step, organic EL layers 40R, 40G, and 40B are formed, while blocking the vapor deposition particles 40 onto the region 30c adjacent to the display regions in the direction parallel with the direction of the relative movement, by vapor depositing the vapor deposition particles 40 onto the pixel formation regions 32R, 32G, and 32B.

The above configuration enables production of an organic EL display device from the vapor deposition target substrate, by which a limitation in degree of freedom in designing is prevented even in performing the scan vapor deposition.

The disclosure is not limited to each of the embodiments stated above, and various modifications may be implemented within a range not departing from the scope of the claims. Embodiments obtained by appropriately combining technical approaches stated in each of the different embodiments also fall within the scope of the technology of the disclosure. Moreover, novel technical features may be formed by combining the technical approaches stated in each of the embodiments.

REFERENCE SIGNS LIST

1 Vapor deposition device
2 Vapor deposition source
3 Rail
10, 10A, 10B Vapor deposition mask
10a Mask end frame part
10b, 10bA, 10bB Mask center frame part
10c Mask body part
11a Slit
11 Vapor deposition region
12 Recessed portion
15 Roller member
17 Sensor
20 Substrate tray
22 Blocking part
23 Crosspiece (bar-shaped member)
30 Vapor deposition target substrate
30a Vapor deposition target surface
30c Region adjacent to display region
31 Display region
32R, 32G, 32B Pixel formation region
33B, 33G, 33R Pixel formation region row
35 Edge cover
40 Vapor deposition particles
40R, 40G, 40B Organic EL layer
50 Organic EL display device

The invention claimed is:
1. A vapor deposition device comprising:
a vapor deposition mask;
a vapor deposition source configured to emit vapor deposition particles toward the vapor deposition mask; and
a substrate tray on which a vapor deposition target substrate is placed, the substrate tray being configured to cause the vapor deposition target substrate to perform a relative movement with respect to the vapor deposition mask, wherein on a vapor deposition target surface of the vapor deposition target substrate, display regions are provided in alignment to be apart from each other in a direction parallel with a direction of the relative movement, and pixel formation regions on which the vapor deposition particles are to be deposited are provided in a matrix in each of the display regions, and the substrate tray includes a blocking part configured to block the vapor deposition particles to be deposited onto a region adjacent to the display region in the direction parallel with the direction of the relative movement.

2. The vapor deposition device according to claim 1, wherein the blocking part covers the region on the vapor deposition target surface, the region being adjacent to the display region in the direction parallel with the direction of the relative movement.

3. The vapor deposition device according to claim 1, wherein a plurality of blocking parts are arranged in alignment in the direction parallel with the direction of the relative movement of the vapor deposition target surface, and the substrate tray further includes a bar-shaped member for coupling the plurality of blocking parts with each other.

4. The vapor deposition device according to claim 3, wherein the bar-shaped member covers a region on the vapor deposition target surface, the region being adjacent to the display regions in a direction perpendicular to the direction of the relative movement.

5. The vapor deposition device according to claim 4, wherein a roller member is arranged at a bottom face of the recessed portion of the vapor deposition mask, the roller member being configured to contact the bar-shaped member to rotate while the vapor deposition target substrate is performing the relative movement.

6. The vapor deposition device according to claim 4, wherein a sensor is arranged on a bottom face of the recessed portion of the vapor deposition mask, the sensor being configured to measure a distance between the bar-shaped member and the bottom face of the recessed portion of the vapor deposition mask while the vapor deposition target substrate is performing the relative movement.

7. The vapor deposition device according to claim 3, wherein a recessed portion is provided on the vapor deposition mask, and allows the bar-shaped member to enter the recessed portion when the vapor deposition target substrate performs the relative movement.

8. The vapor deposition device according to claim 3, wherein the bar-shaped member includes a polarized region to be polarized.

9. The vapor deposition device according to claim 8, wherein after the bar-shaped member enters the recessed portion of the vapor deposition mask, the polarized region is provided in the bar-shaped member.

10. A method for producing an organic EL display, the method comprising:

causing a substrate tray on which a vapor deposition target substrate is placed to perform a relative movement with respect to a vapor deposition mask; and emitting vapor deposition particles from a vapor deposition source toward the vapor deposition mask, wherein on a vapor deposition target surface of the vapor deposition target substrate, display regions are provided in alignment to be apart from each other in a direction parallel with a direction of the relative movement, and pixel forming regions on which the vapor deposition particles are to be deposited are provided in a matrix in each of the display regions, and in the causing the substrate tray to perform the relative movement and the emitting the vapor deposition particles, organic EL layers are formed, while blocking the vapor deposition particles to be deposited onto a region adjacent to the display regions in the direction parallel with the direction of the relative movement, by vapor depositing the vapor deposition particles onto the pixel formation regions.

* * * * *